(12) United States Patent
Cho

(10) Patent No.: US 9,704,787 B2
(45) Date of Patent: Jul. 11, 2017

(54) COMPACT SINGLE-DIE POWER SEMICONDUCTOR PACKAGE

(71) Applicant: Infineon Technologies Americas Corp., El Segundo, CA (US)

(72) Inventor: Eung San Cho, Torrance, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/515,720

(22) Filed: Oct. 16, 2014

(65) Prior Publication Data

US 2016/0111355 A1    Apr. 21, 2016

(51) Int. Cl.
*H01L 23/15* (2006.01)
*H01L 23/495* (2006.01)
*H01L 23/00* (2006.01)

(52) U.S. Cl.
CPC .. *H01L 23/49562* (2013.01); *H01L 23/49524* (2013.01); *H01L 23/49548* (2013.01); *H01L 24/33* (2013.01); *H01L 24/40* (2013.01); *H01L 24/48* (2013.01); *H01L 2224/32245* (2013.01); *H01L 2224/33181* (2013.01); *H01L 2224/48106* (2013.01); *H01L 2224/48247* (2013.01); *H01L 2224/73265* (2013.01); *H01L 2924/00014* (2013.01); *H01L 2924/1033* (2013.01); *H01L 2924/10253* (2013.01); *H01L 2924/1306* (2013.01); *H01L 2924/13055* (2013.01); *H01L 2924/13064* (2013.01); *H01L 2924/14252* (2013.01)

(58) Field of Classification Search
CPC ............. H01L 29/66734; H01L 29/781; H01L 29/7813; H01L 29/7827; H01L 29/82; H01L 41/113; H01L 51/0052; H01L 51/0054

USPC .......................................................... 257/705
See application file for complete search history.

(56) References Cited

U.S. PATENT DOCUMENTS

| | | | |
|---|---|---|---|
| 6,624,522 B2 * | 9/2003 | Standing et al. | ............. 257/782 |
| 7,271,470 B1 | 9/2007 | Otremba | |
| 7,285,849 B2 | 10/2007 | Cruz | |
| 7,301,235 B2 | 11/2007 | Schaffer | |
| 7,663,212 B2 | 2/2010 | Otremba | |
| 7,800,217 B2 * | 9/2010 | Otremba | ........... H01L 23/49524 257/686 |
| 7,804,131 B2 * | 9/2010 | Cheah | ............... H01L 23/49524 257/341 |

(Continued)

OTHER PUBLICATIONS

Response to Office Action dated Sep. 7, 2016, from U.S. Appl. No. 14/515,860, filed Nov. 29, 2016, 11 pp.

(Continued)

*Primary Examiner* — Xinning Niu
*Assistant Examiner* — Vu A Vu
(74) *Attorney, Agent, or Firm* — Shumaker & Sieffert, P.A.

(57) ABSTRACT

Disclosed is a power semiconductor package including a power transistor having a first power electrode and a gate electrode on its top surface and a second power electrode on its bottom surface. The second power electrode is configured for attachment to a partially etched leadframe segment, where the partially etched leadframe segment is attached to a substrate. A conductive clip is situated over the first power electrode and extends to the substrate in order to couple the first power electrode to the substrate without using a leadframe.

13 Claims, 4 Drawing Sheets

(56) References Cited

U.S. PATENT DOCUMENTS

| | | | |
|---|---|---|---|
| 7,972,906 B2 * | 7/2011 | Cruz | H01L 23/49524 257/706 |
| 8,680,656 B1 * | 3/2014 | Kuo | H01L 31/0508 257/13 |
| 8,884,420 B1 * | 11/2014 | Hosseini | H01L 23/49575 257/676 |
| 2004/0061221 A1 | 4/2004 | Schaffer | |
| 2005/0161785 A1 * | 7/2005 | Kawashima | H01L 23/49575 257/678 |
| 2006/0017174 A1 | 1/2006 | Otremba | |
| 2006/0151861 A1 | 7/2006 | Noquil | |
| 2007/0090523 A1 | 4/2007 | Otremba | |
| 2007/0114352 A1 * | 5/2007 | Cruz et al. | 248/316.7 |
| 2008/0211070 A1 * | 9/2008 | Sun | H01L 29/045 257/676 |
| 2010/0133670 A1 * | 6/2010 | Liu et al. | 257/675 |
| 2011/0049690 A1 * | 3/2011 | Cho | H01L 21/4832 257/676 |
| 2012/0181674 A1 | 7/2012 | Cho | |
| 2012/0241926 A1 * | 9/2012 | Camacho | H01L 21/4832 257/666 |
| 2012/0248521 A1 | 10/2012 | Herbsommer | |
| 2012/0280308 A1 | 11/2012 | Disney | |
| 2012/0292752 A1 | 11/2012 | Cho | |
| 2012/0292753 A1 | 11/2012 | Cho | |
| 2013/0161801 A1 * | 6/2013 | Otremba | H01L 23/24 257/668 |
| 2016/0111356 A1 | 4/2016 | Cho | |

OTHER PUBLICATIONS

Prosecution History from U.S. Appl. No. 14/515,860, dated Jul. 2, 2015 through Sep. 7, 2016, 98 pp.

Notice of Allowance from U.S. Appl. No. 14/515,860 mailed Jan. 17, 2017, 8 pp.

* cited by examiner

COMPACT SINGLE-DIE POWER SEMICONDUCTOR PACKAGE

BACKGROUND

For optimization of form factor, performance, and manufacturing cost, it is often desirable to integrate components of a power circuit, such as a half-bridge based DC-DC converter or a voltage converter, in a single semiconductor package. Thus, several semiconductor package designs have been developed to integrate the power transistors of a power circuit within a compact package. To provide sufficient electrical performance for the reliable operation of high power semiconductor packages, it is crucial to ensure high current carrying capability and low resistance for connection between the transistors of the power circuit.

Various high power semiconductor package designs use multiple leadframes, including leadframes for connecting conductive clips to a substrate, undesirably increasing electrical resistance and reducing current carrying capability. Additionally, package design rules to successfully accommodate multiple leadframes and a conductive clip require a large degree of tolerance (i.e. a large clearance space) for manufacturing, thus undesirably increasing package form factor and complexity. For example, package height and width have to be increased to provide sufficient space for the multiple leadframes and a conductive clip, and additional area on the package may be reserved for necessary electrical connections. Additionally, the increased package complexity resulting from the use of multiple leadframes and a conductive clip may negatively affect manufacturing time, cost, and package yields.

SUMMARY

A compact single-die power semiconductor package, substantially as shown in and/or described in connection with at least one of the figures, and as set forth more completely in the claims.

DETAILED DESCRIPTION

Figure 1:
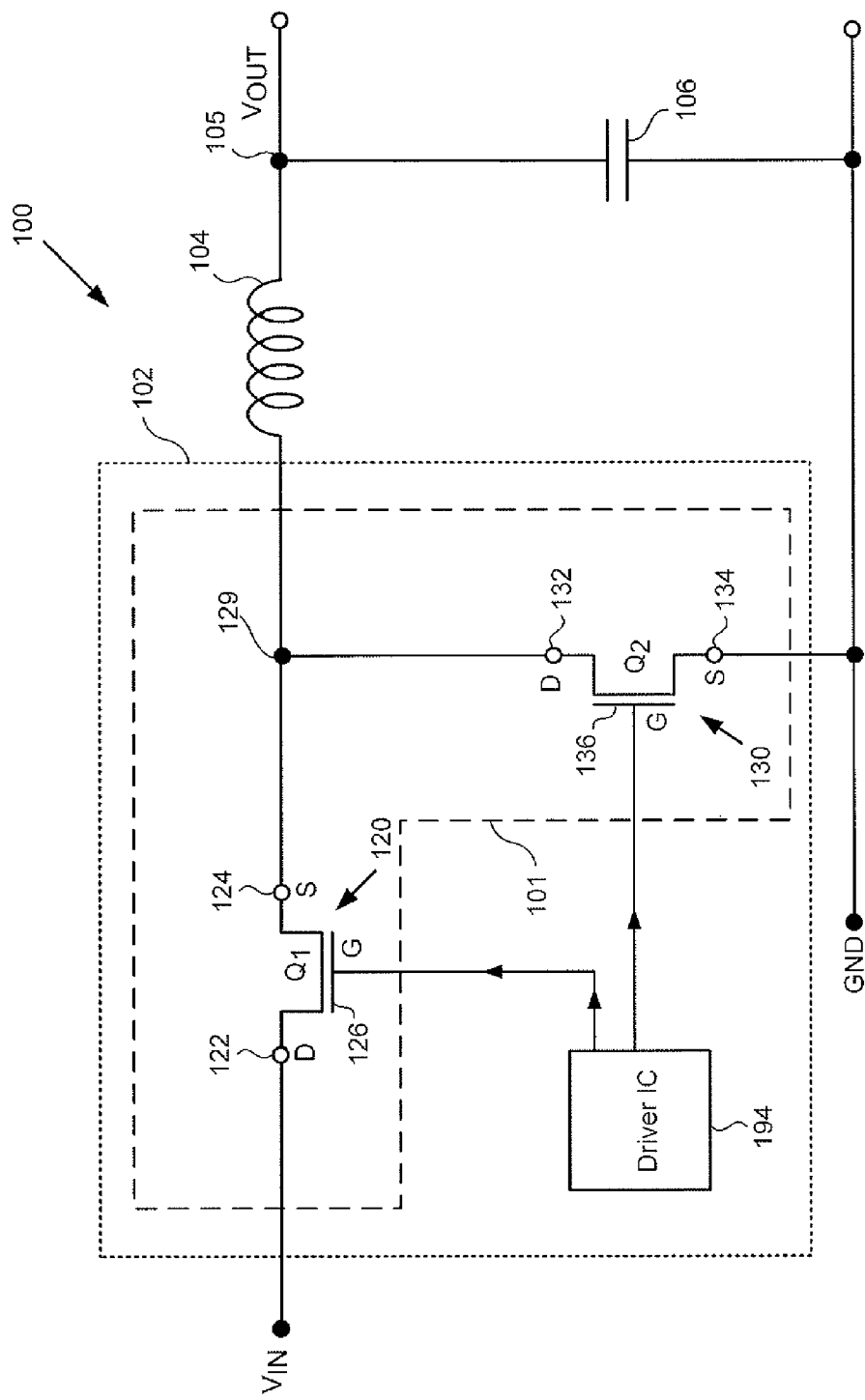
FIG. 1 illustrates a diagram of an exemplary circuit suitable for use as a voltage converter.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

The drawings in the present application and their accompanying detailed description are directed to merely exemplary implementations of the present disclosure. To maintain brevity, other implementations of the present disclosure, which use the principles of the present inventive concepts, are not specifically described in the present application and are not specifically illustrated by the present drawings.

Voltage converters are used in a variety of electronic circuits and systems. For example, various applications may require conversion of a direct current (DC) input to a lower, or higher, DC output. As a specific example, a buck converter may be implemented as a voltage regulator to convert a higher voltage DC input to a lower voltage DC output for use in low voltage applications.

FIG. 1 illustrates a diagram of an exemplary circuit suitable for use as a voltage converter. Voltage converter 100 includes voltage converter multi-chip module (MCM) 102, output inductor 104, and output capacitor 106. As shown in FIG. 1, MCM 102 includes power switching stage 101 of voltage converter 100, and driver IC 194 implemented to provide drive signals to power switching stage 101. As shown in FIG. 1, voltage converter 100 is configured to receive an input voltage $V_{IN}$, and to provide a converted voltage, e.g., a rectified and/or stepped down voltage, as $V_{OUT}$ at output 105.

Power switching stage 101 may be implemented using two power transistors in the form of metal-oxide-semiconductor field-effect transistors (MOSFETs) configured as a half bridge, for example. That is to say, power switching stage 101 may include high side or control transistor 120 ($Q_1$) having drain 122, source 124, and gate 126, as well as low side or sync transistor 130 ($Q_2$) having drain 132, source 134, and gate 136. Control transistor 120 is coupled to sync transistor 130 at switch node 129, which, in turn, is coupled to output 105 through output inductor 104. Respective control and sync transistors 120 and 130 may be implemented as field-effect transistors (FETs), insulated gate bipolar transistors (IGBTs), or high electron mobility transistors (HEMTs), for example. More specifically, respective control and sync transistors 120 and 130 may be implemented as silicon FETs or gallium nitride (GaN) FETs. Voltage converter 100 may be advantageously used, for example as a buck converter, in a variety of automotive, industrial, appliance, and lighting applications.

Figure 2:
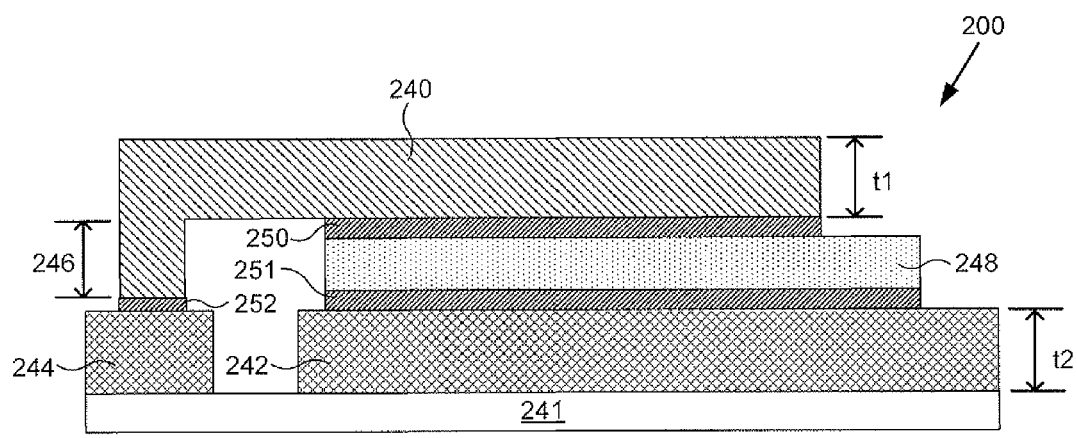
FIG. 2 illustrates a cross-sectional view of a power semiconductor package.
Figure 3:
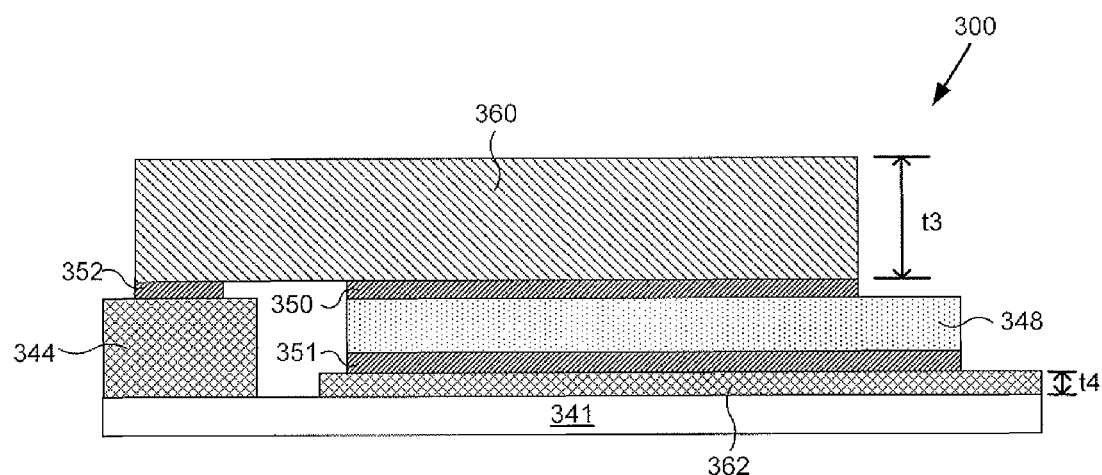
FIG. 3 illustrates a cross-sectional view of another power semiconductor package.
Figure 4A:
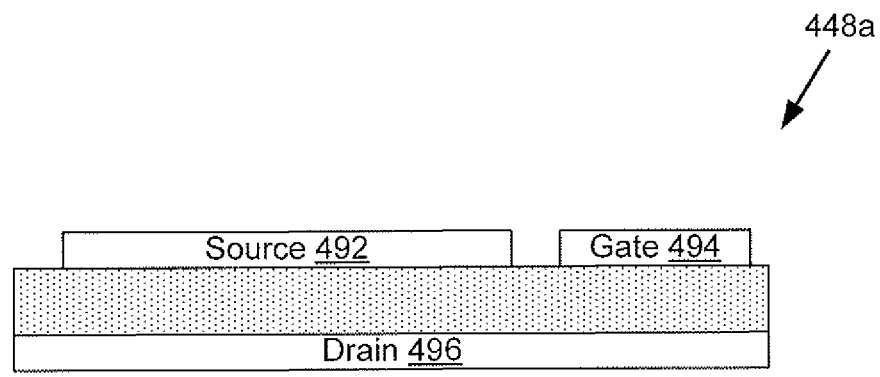
FIG. 4A illustrates a cross-sectional view of a power transistor for use in a power semiconductor package.
Figure 4B:
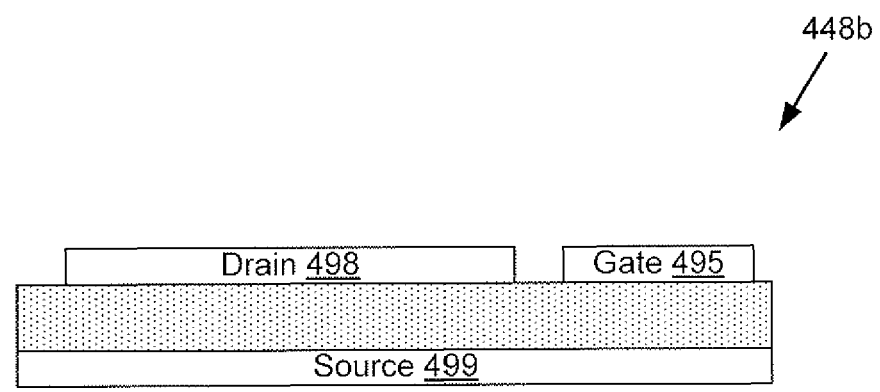
FIG. 4B illustrates a cross-sectional view of another power transistor for use in a power semiconductor package.
Figure 4C:
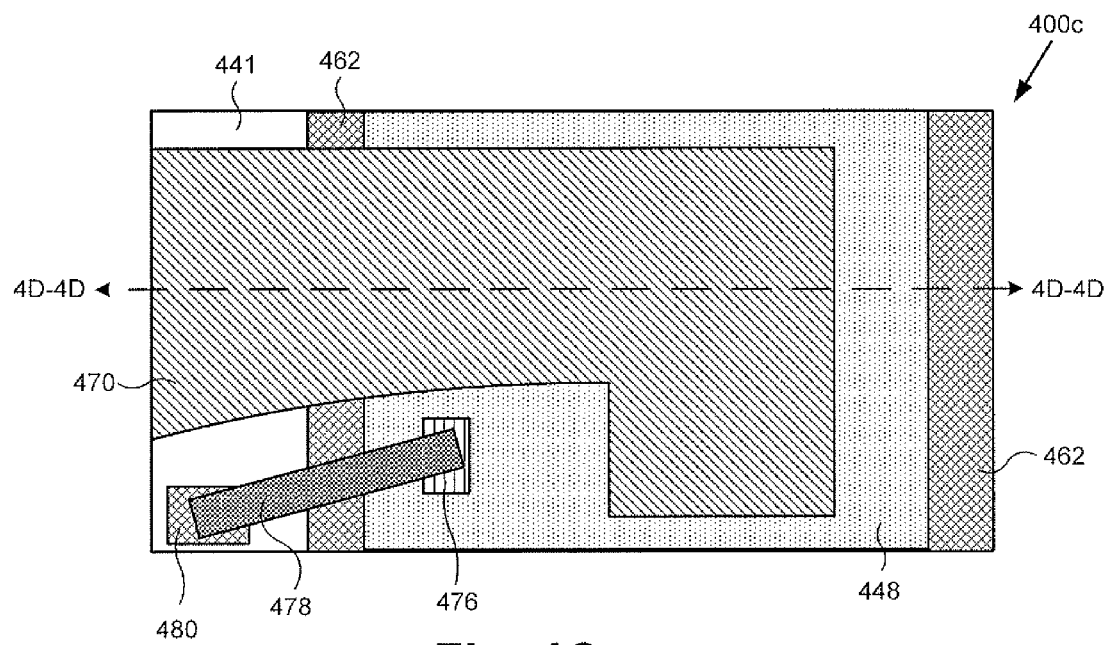
FIG. 4C illustrates a top view of an exemplary power semiconductor package, in accordance with one implementation of the present disclosure.
Figure 4D:
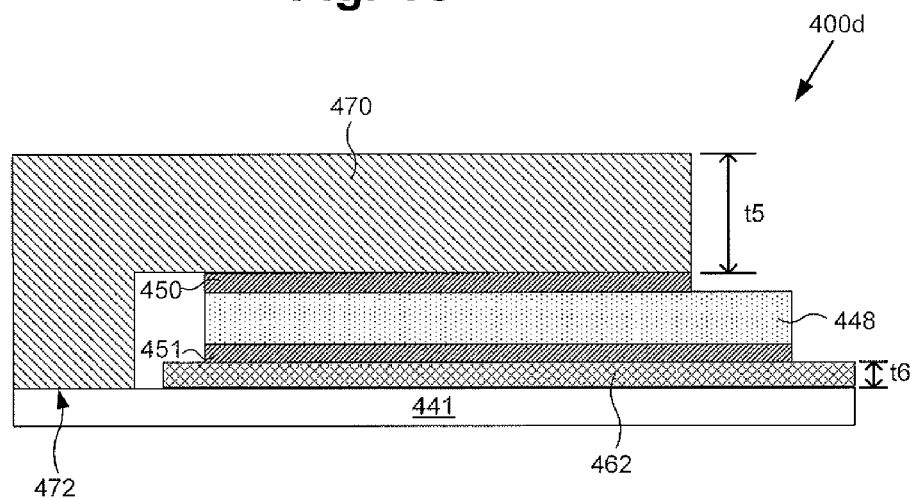
FIG. 4D illustrates a cross-sectional view of an exemplary power semiconductor package, in accordance with one implementation of the present disclosure.

It should be noted with reference to FIG. 2, FIG. 3, FIG. 4A, and FIG. 4B that implementations of the present disclosure are described with respect to a single power transistor within a power semiconductor package, such as power transistor 248 within power semiconductor package 200 of FIG. 2, power transistor 348 within power semiconductor package 300 of FIG. 3, and power transistor 448 within power semiconductor package 400d of FIG. 4D. Each power transistor 248, power transistor 348, and power transistor 448 may correspond to a power transistor such as control transistor 120 or sync transistor 130 of FIG. 1. In some implementations, a circuit board may include a power transistor 448 corresponding to control transistor 120 and another power transistor 448 corresponding to sync transistor 130 electrically coupled to one another in a manner shown in voltage converter 100 of FIG. 1.

As another example, in one implementation, power transistor 448 of FIG. 4D may correspond to control transistor 120 and another power transistor 448 may correspond to sync transistor 130. Each power transistors 448 may be electrically coupled to a driver IC, an output inductor, and an output capacitor, such as driver IC 194, output inductor 104, and output capacitor 106 of FIG. 1, according to the exemplary voltage converter 100 of FIG. 1.

FIG. 2 illustrates a cross-sectional view of a power semiconductor package. Power semiconductor package 200 includes conductive clip 240, leadframe segment 242, leadframe segment 244, power transistor 248, conductive adhesive 250, conductive adhesive 251, conductive adhesive 252, and substrate 241.

Conductive clip 240 of power semiconductor package 200 is configured to electrically couple a power electrode situated on top of power transistor 248 to leadframe segment 244. Conductive clip 240 is situated over power transistor 248 and electrically and mechanically coupled to power transistor 248 by conductive adhesive 250. Leg portion 246 of conductive clip 240 is electrically and mechanically coupled to leadframe segment 244 by conductive adhesive 252.

Conductive clip 240 has thickness t1 that is dependent on the current carrying capability needs of the particular implementation. For example, in some implementations, the current carrying capability needs may be high, resulting in a greater thickness t1 of conductive clip 240 and consequently a greater overall height of power semiconductor package 200.

Leadframe segment 244 of power semiconductor package 200 is configured to couple conductive clip 240 to substrate 241. Leadframe segment 244 is electrically and mechanically coupled to conductive clip 240 using conductive adhesive 252. Leadframe segment 244 is also electrically and mechanically coupled to substrate 241 using a leadframe pad or a conductive adhesive, for example.

Leadframe segment 244, as illustrated in FIG. 2, must generally be wider than leg portion 246 of conductive clip 240 in order to account for manufacturing tolerances. For example, because conductive adhesive 252 may spill over and/or extend beyond the width of leg portion 246 of conductive clip 240, leadframe segment 244 must be wider than leg portion 246 of conductive clip 240 in order to account for the spill over and/or extension. In addition, leadframe segment 244 must be wider than leg portion 246 of conductive clip 240 to account for misalignment of conductive clip 240 during attachment to leadframe segment 244 during manufacturing. As a result of the increased width of leadframe segment 244, the overall width and form factor of power semiconductor package 200 is increased, requiring more space on substrate 241.

Leadframe segment 242 of power semiconductor package 200 is configured to couple at least one power electrode of power transistor 248 to substrate 241. Leadframe segment 242 is electrically and mechanically coupled to power transistor 248 by conductive adhesive 251. Leadframe segment 242 is also electrically and mechanically coupled to substrate 241 using a leadframe pad or a conductive adhesive, for example.

Leadframe segment 242 has thickness t2 that is dependent on a number of factors. Thickness t2 of leadframe segment 242 must allow for mechanical and electrical coupling between power transistor 248 and conductive clip 240 along with mechanical and electrical coupling between power transistor 248 and leadframe segment 242. Furthermore, because leg portion 246 of conductive clip 240 increases the overall height of conductive clip 240 within power semiconductor package 200, thickness t2 of leadframe segment 242 must increase in order to ensure power transistor 248 is mechanically and electrically coupled to conductive clip 240. As a result, thickness t2 of leadframe segment 242 is increased resulting in an increased size of power semiconductor package 200.

FIG. 3 illustrates a cross-sectional view of another power semiconductor package. Power semiconductor package 300 includes top leadframe segment 360, leadframe segment 344, partially etched leadframe segment 362, power transistor 348, conductive adhesive 350, conductive adhesive 351, conductive adhesive 352, and substrate 341.

Top leadframe segment 360 of power semiconductor package 300 is configured to electrically couple a power electrode situated on top of power transistor 348 to leadframe segment 344. Top leadframe segment 360 is situated over power transistor 348 and electrically and mechanically coupled to power transistor 348 by conductive adhesive 350. Top leadframe segment 360 is electrically and mechanically coupled to leadframe segment 344 by conductive adhesive 352.

Top leadframe segment 360 has thickness t3 that is dependent on the current carrying capability needs of the particular implementation. For example, in some implementations, the current carrying capability needs may be high, resulting in a greater thickness t3 of top leadframe segment 360. Comparing conductive clip 240 of semiconductor package 200 to top leadframe segment 360 of semiconductor package 300, thickness t3 of top leadframe segment 360 can be greater than thickness t1 of conductive clip 240, thus providing a better current carrying capability than that provided by semiconductor package 200, while preserving the same height and form factor as semiconductor package 200. Thickness t3 can be greater than thickness t1 due to thickness t4 of partially etched leadframe segment 362 of semiconductor package 300 being less than thickness t2 of leadframe segment 242 of semiconductor package 200 (partially etched leadframe segment 362 will be described in greater detail below).

Thus, as a result of thickness t4 being less than thickness t2, thickness t3 of top leadframe segment 360 can be increased, directly increasing the current carrying capability of top leadframe segment 360 without increasing the overall package height of power semiconductor package 300 as compared to power semiconductor package 200 of FIG. 2. More specifically, the space increase within power semiconductor package 300 due to thickness t4 being less than thickness t2 is used to increase thickness t3 of top leadframe segment 360. In such an implementation, the size of power semiconductor package 300 can be decreased as compared to power semiconductor package 200 while concurrently increasing the current carrying capability of top leadframe segment 360 compared to the current carrying capability of conductive clip 240.

Leadframe segment 344 of power semiconductor package 300 is configured to couple top leadframe segment 360 to substrate 341. Leadframe segment 344 is electrically and mechanically coupled to top leadframe segment 360 using conductive adhesive 352. Leadframe segment 344 is also electrically and mechanically coupled to substrate 341 using a leadframe pad or a conductive adhesive, for example.

Leadframe segment 344, as illustrated in FIG. 3, must generally be wider than the desired width of conductive adhesive 352 in order to account for manufacturing tolerances. For example, because conductive adhesive 352 may spill over and/or extend beyond the width desired, leadframe segment 344 must be wider in order to account for the spill over and/or extension. In addition, leadframe segment 344 must be wider than conductive adhesive 352 to account for misalignment of top leadframe segment 360 during attachment to leadframe segment 344 during manufacturing. As a result of the increased width of leadframe segment 344 more space on substrate 341 is required, subsequently requiring an increase in the overall width and form factor of power semiconductor package 300.

Partially etched leadframe segment 362 of power semiconductor package 300 is configured to couple at least one power electrode of power transistor 348 to substrate 341. Partially etched leadframe segment 362 is electrically and mechanically coupled to power transistor 348 by conductive adhesive 351. Partially etched leadframe segment 362 is also electrically and mechanically coupled to substrate 341 using a leadframe pad or a conductive adhesive, for example.

Partially etched leadframe segment 362 has thickness t4 that is dependent on a number of factors. Thickness t4 of partially etched leadframe segment 362 must allow for mechanical and electrical coupling between power transistor 348 and top leadframe segment 360 along with mechanical and electrical coupling between power transistor 348 and partially etched leadframe segment 362.

As illustrated in FIGS. 2 and 3 and as described above, thickness t4 of partially etched leadframe segment 362 is less than thickness t2 of leadframe segment 242. As a result, thickness t3 of top leadframe segment 360 can be increased as compared to thickness t1 of conductive clip 240, resulting in a higher current carrying capability. Additionally, thickness t4 allows for a reduction in the overall package height of power semiconductor package 300 as compared to power semiconductor package 200 of FIG. 2.

FIG. 4A illustrates a simplified cross-sectional view of a power transistor for use in a power semiconductor package. Power transistor 448a of FIG. 4A includes source 492, gate 494, and drain 496. Source 492 is a power electrode situated on a top surface of power transistor 448a. Drain 496 is a power electrode situated on a bottom surface of power transistor 448a. Gate 494 is a gate electrode situated on the top surface of power transistor 448a. In some implementations, power transistor 448 of FIG. 4C and FIG. 4D discussed below has the same drain, source, and gate configuration of power transistor 448a of FIG. 4A.

FIG. 4B illustrates a simplified cross-sectional view of another power transistor for use in a power semiconductor package. Power transistor 448b of FIG. 4B includes source 499, gate 495, and drain 498. Source 499 is a power electrode situated on a bottom surface of power transistor 448b. Drain 498 is a power electrode situated on a top surface of power transistor 448b. Gate 495 is a gate electrode situated on the top surface of power transistor 448b. In some implementations, power transistor 448 of FIG. 4C and FIG. 4D discussed below has the same drain, source, and gate configuration of power transistor 448b of FIG. 4B.

FIG. 4C illustrates a top view of an exemplary power semiconductor package, in accordance with one implementation of the present disclosure. Power semiconductor package 400c of FIG. 4C includes partially etched leadframe segment 462, power transistor 448, first conductive clip 470, substrate 441, gate leadframe segment 480, second conductive clip 478, and gate electrode 476.

Power transistor 448 of FIG. 4C is configured to be coupled to partially etched leadframe segment 462, first conductive clip 470, and second conductive clip 478. Power transistor 448 is configured to be electrically and mechanically coupled to first conductive clip 470 and second conductive clip 478. Power transistor is further configured to be electrically and mechanically coupled to partially etched leadframe segment 462. Power transistor 448 may be a field-effect transistor (FET), insulated gate bipolar transistor (IGBT), or a high electron mobility transistor (HEMT), for example. More specifically, power transistor 448 may be a silicon FET or a gallium nitride (GaN) FET.

Power transistor 448 includes a source electrode, a drain electrode, and a gate electrode (shown as gate electrode 476 in FIG. 4C). The configuration of the source electrode, the drain electrode, and the gate electrode may be similar to that of power transistor 448a of FIG. 4A or that of power transistor 448b of FIG. 4B. For example, in an implementation of power semiconductor package 400c using the configuration of power transistor 448a of FIG. 4A, the source electrode may be source 492, gate electrode 476 may be gate 494, and the drain electrode may be drain 496. In such an implementation, first conductive clip 470 is electrically and mechanically coupled to source 492, second conductive clip 478 is electrically and mechanically coupled to gate 494, and partially etched leadframe segment 462 is electrically and mechanically coupled to drain 496.

In yet another implementation, power semiconductor package 400c uses the configuration of power transistor 448b of FIG. 4B. In such an implementation, the source electrode may be source 499, gate electrode 476 may be gate 495, and the drain electrode may be drain 496. As such, first conductive clip 470 is electrically and mechanically coupled to drain 498, second conductive clip 478 is electrically and mechanically coupled to gate 495, and partially etched leadframe segment 462 is electrically and mechanically coupled to source 499.

First conductive clip 470 is configured to couple power transistor 448 to substrate 441 without using a leadframe. First conductive clip 470 may be electrically and mechanically coupled to power transistor 448 using a conductive adhesive such as solder, for example. First conductive clip 470 may cover more or less surface area of power transistor 448 than illustrated in FIG. 4C depending on the thermal and current carrying capability requirements of power semiconductor package 400c. In addition, first conductive clip 470 may have an "L" shape with at least one curved side, as illustrated in FIG. 4C, or may have another suitable shape to maximize surface area within power semiconductor package 400a.

Second conductive clip 478 is configured to couple gate electrode 476 to substrate 441. Second conductive clip 478 may electrically and mechanically couple gate electrode 476 to gate leadframe segment 480. In some implementations, second conductive clip 478 may be replaced with a wire bond. Gate leadframe segment 480 may be electrically and mechanically coupled to substrate 441 in order to electrically couple second conductive clip 478 to substrate 441. Second conductive clip 478 may include a metal such as copper, a metal alloy, or another highly conductive material.

Although the implementation illustrated in FIG. 4C includes gate leadframe segment 480, the present disclosure is not limited to the implementation of FIG. 4C. For example, in some implementations, second conductive clip 478 may be electrically and mechanically coupled to substrate 441 without using gate leadframe segment 480. In such an implementation, second conductive clip 478 is situated over gate electrode 476 and extends to substrate 441 without using a leadframe. As a result, the manufacturing tolerance required for coupling second conductive clip 478 to gate leadframe segment 480 is avoided thereby reducing manufacturing costs and difficulty while concurrently reducing the overall size of power semiconductor package 400c.

FIG. 4D illustrates a cross-sectional view of an exemplary power semiconductor package, in accordance with one implementation of the present disclosure. More specifically, FIG. 4D illustrates the cross-sectional view along dashed line 4D-4D in FIG. 4C. Power semiconductor package 400*d* of FIG. 4D includes first conductive clip 470, power transistor 448, partially etched leadframe segment 462, conductive adhesive 450, conductive adhesive 451, and substrate 441. It should be noted with respect to FIG. 4D that power semiconductor package 400*d* corresponds to power semiconductor package 400*c* of FIG. 4C, first conductive clip 470 corresponds to first conductive clip 470 of FIG. 4C, power transistor 448 corresponds to power transistor 448 of FIG. 4C, partially etched leadframe segment 462 corresponds to partially etched leadframe segment 462 of FIG. 4C, and substrate 441 corresponds to substrate 441 of FIG. 4C.

Conductive adhesive 450 is configured to mechanically and electrically couple first conductive clip 470 to power transistor 448. Conductive adhesive 451 is configured to mechanically and electrically couple power transistor 448 to partially etched leadframe segment 462. Conductive adhesive 450 and 451 may include a conductive adhesive material, a solder paste, solder tape, solder, a silver filled adhesive such as QMI 529HT, or another attachment means.

Substrate 441 includes a plurality of portions configured to electrically couple to the power electrodes and gate electrode of power semiconductor package 400*d*. First conductive clip 470 and partially etched leadframe segment 462 are electrically and mechanically coupled to substrate 441 using conductive pads or a conductive adhesive, for example. Substrate 441 may be a circuit board, for example a printed circuit board (PCB), or another suitable substrate.

Substrate 441 uses conductive traces or other conductive means to electrically couple the required components of power semiconductor package 400*d*. For example, in reference to FIG. 1 and FIG. 4A, an implementation where the configuration of power transistor 448 is similar to power transistor 448*a* of FIG. 4A, first conductive clip 470 couples source 492 to substrate 441, second conductive clip couples gate 494 to substrate 441, and partially etched leadframe segment 462 couples drain 496 to substrate 441. Substrate 441 may include conductive traces to electrically couple each of source 492, gate 494, and drain 496 of power transistor 448.

First conductive clip 470 is configured to be coupled to power transistor 448 and substrate 441. First conductive clip 470 is configured to be electrically and mechanically coupled to power transistor 448 using conductive adhesive 450. First conductive clip 470 is situated over and mechanically and electrically coupled to a power electrode of power transistor 448. First conductive clip 470 is further configured to be electrically and mechanically coupled to substrate 441. First conductive clip 470 may include a metal such as copper, a metal alloy, or another highly conductive material.

As illustrated in FIG. 4D, first conductive clip 470 extends to substrate 441 without using a leadframe. More specifically, bottom surface 472 of first conductive clip 470 is mechanically and electrically coupled to substrate 441 using a conductive adhesive, a conductive pad, or another suitable attachment material, for example.

Moreover, power semiconductor package 400*d* including first conductive clip 470 provides several advantages over power semiconductor package 200 of FIG. 2 and power semiconductor package 300 of FIG. 3. First conductive clip 470 does not require an extra conductive adhesive or an additional leadframe, such as conductive adhesive 252 and leadframe segment 244 of power semiconductor package 200 or conductive adhesive 352 and leadframe segment 344 of power semiconductor package 300. As a result, manufacturing costs, complexity, and time for power semiconductor package 400*d* are reduced. In addition, no manufacturing tolerance is required for the application of a conductive adhesive on a leadframe, thus reducing the overall width of power semiconductor package 400*d* as compared to power semiconductor package 200 and power semiconductor package 300.

Additionally, because first conductive clip 470 extends to substrate 441, first conductive clip 470 has increased size compared to conductive clip 240 of FIG. 2 and top leadframe segment 360 of FIG. 3. As a result, first conductive clip 470 provides a low resistance, high current path for the coupling of the power electrode of power transistor 448 to substrate 441.

First conductive clip 470 has thickness t5. In some implementations, thickness t5 is a similar thickness to thickness t3 of top leadframe segment 360 of FIG. 3 and consequently provides similar advantages as thickness t3 of top leadframe segment 360 over conductive clip 240 of FIG. 2, as discussed above. For example, the increase of thickness t5 does not require an increase in overall package height of power semiconductor package 400*d* as compared to power semiconductor package 200 of FIG. 2, because the space increase within power semiconductor package 400*d* due to thickness t6 being less than thickness t2 of conductive clip 240 in FIG. 2 is used to increase thickness t5 of first conductive clip 470. In some implementations, thickness t5 may be determined such that the overall height of power semiconductor package 400*d* is less than the overall height of power semiconductor package 200 of FIG. 2. In such an implementation, the overall size of power semiconductor package 400*d* is decreased as compared to power semiconductor package 200 in addition to an increase of the current carrying capability of first conductive clip 470 as compared to the current carrying capability of conductive clip 240.

Partially etched leadframe segment 462 of power semiconductor package 400*d* is configured to couple at least one power electrode of power transistor 448 to substrate 441. Partially etched leadframe segment 462 is electrically and mechanically coupled to power transistor 448 by conductive adhesive 451. Partially etched leadframe segment 462 is also electrically and mechanically coupled to substrate 441 using a leadframe pad or a conductive adhesive, for example. Partially etched leadframe segment 462 may include a metal, such as copper, aluminum, or tungsten, a metal alloy, a tri-metal or other conductive material.

Partially etched leadframe segment 462 has thickness t6 that is dependent on a number of factors. Thickness t6 of partially etched leadframe segment 462 must allow for mechanical and electrical coupling between power transistor 448 and first conductive clip 470 along with mechanical and electrical coupling between power transistor 448 and partially etched leadframe segment 462.

Similar to the differences between thickness t4 of FIG. 3 and thickness t2 of FIG. 2 discussed above, thickness t6 of partially etched leadframe segment 462 is less than thickness t2 of leadframe segment 242 of FIG. 2. As a result, thickness t5 of first conductive clip 470 can be increased as compared to thickness t1 of conductive clip 240, resulting in a higher current carrying capability. Additionally, thickness t6 allows for a reduction in the overall package height of power semiconductor package 400*d* as compared to power semiconductor package 200 of FIG. 2.

According to the present disclosure, by using partially etched leadframe segment 462 to connect power transistor 448 to substrate 441, and by coupling first conductive clip 470 to substrate 441 without using a leadframe, power semiconductor package 400d achieves increased current carrying capability and reduced electrical resistance, form factor, complexity, and cost when compared to other packaging techniques using additional leadframes in combination with conductive clips such as conductive clip 240 and leadframe segment 244 of FIG. 2. Additionally, the large surface area provided by first conductive clip 470 allows for more efficient input and output current conduction.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A power semiconductor package comprising:
    a power transistor having a first power electrode and a gate electrode on a top surface of said power transistor, and a second power electrode on a bottom surface of said power transistor;
    said second power electrode being configured for attachment to a partially etched leadframe segment, said partially etched leadframe segment having a thickness across an entire length thereof and being configured for attachment to a substrate that is separate from said power semiconductor package;
    a first conductive clip having a substantially horizontal portion situated over said first power electrode and a substantially vertical portion connected to said substantially horizontal portion, said first conductive clip being coupled to said first power electrode and being configured for attachment to said substrate that is separate from said power semiconductor package by said substantially vertical portion without using a leadframe; and
    a second conductive clip configured for coupling said gate electrode to said substrate;
    wherein said substantially horizontal portion of said first conductive clip has a thickness that is greater than said thickness of said partially etched leadframe segment.

2. The power semiconductor package of claim 1, wherein said substrate is a circuit board.

3. The power semiconductor package of claim 1, wherein said power transistor is selected from the group consisting of a FET, an IGBT, and a HEMT.

4. The power semiconductor package of claim 1, wherein said power transistor is selected from the group consisting of a silicon FET and a GaN FET.

5. The power semiconductor package of claim 1, wherein said first power electrode is a source electrode and said second power electrode is a drain electrode.

6. The power semiconductor package of claim 1, wherein said first power electrode is a drain electrode and said second power electrode is a source electrode.

7. The power semiconductor package of claim 1, wherein said power transistor is part of a voltage converter.

8. The power semiconductor package of claim 1, wherein said substantially vertical portion of said first conductive clip has a thickness that is greater than said thickness of said partially etched leadframe segment, and wherein said substantially vertical portion of said first conductive clip has a length that is less than a length of said partially etched leadframe segment.

9. A power semiconductor package comprising:
    a power FET having a source electrode and a gate electrode on a top surface of said power FET, and a drain electrode on a bottom surface of said power FET;
    said drain electrode being configured for attachment to a partially etched leadframe segment, said partially etched leadframe segment having a thickness across an entire length thereof and being configured for attachment to a circuit board that is separate from said power semiconductor package;
    a first conductive clip having a substantially horizontal portion situated over said source electrode and a substantially vertical portion connected to said substantially horizontal portion, said first conductive clip being coupled to said source electrode and being configured for attachment to said circuit board that is separate from said power semiconductor package by said substantially vertical portion, without using a leadframe thereby reducing a size of said power semiconductor package; and
    a second conductive clip configured for coupling said gate electrode to said circuit board;
    wherein said substantially horizontal portion of said first conductive clip has a thickness that is greater than said thickness of said partially etched leadframe segment, and wherein said substantially vertical portion of said first conductive clip has a thickness that is greater than said thickness of said partially etched leadframe segment.

10. The power semiconductor package of claim 9, wherein said power FET is selected from the group consisting of a silicon FET and a GaN FET.

11. The power semiconductor package of claim 9, wherein said substantially vertical portion of said first conductive clip has a length that is less than a length of said partially etched leadframe segment.

12. A power semiconductor package comprising:
    a power FET having a drain electrode and a gate electrode on a top surface of said power FET, and a source electrode on a bottom surface of said power FET;
    said source electrode being configured for attachment to a partially etched leadframe segment, said partially etched leadframe segment having a thickness across an entire length thereof and being configured for attachment to a circuit board that is separate from said power semiconductor package;
    a first conductive clip having a substantially horizontal portion situated over said drain electrode and a substantially vertical portion connected to said substantially horizontal portion, said first conductive clip being coupled to said drain electrode and being configured for attachment to said circuit board that is separate from said power semiconductor package by said substantially vertical portion, without using a leadframe thereby reducing a size of said power semiconductor package; and
    a second conductive clip configured for coupling said gate electrode to said circuit board;
    wherein said substantially horizontal portion of said first conductive clip has a thickness that is greater than said thickness of said partially etched leadframe segment, said substantially vertical portion of said first conductive clip has a thickness that is greater than said thickness of said partially etched leadframe segment, and said substantially vertical portion of said first conductive clip has a length that is less than a length of said partially etched leadframe segment.

13. The power semiconductor package of claim 12, wherein said power FET is selected from the group consisting of a silicon FET and a GaN FET.

* * * * *